United States Patent [19]
Chu

[11] Patent Number: 5,835,347
[45] Date of Patent: Nov. 10, 1998

[54] CPU HEAT DISSIPATING DEVICE

[75] Inventor: Ching-Hung Chu, Yi Lan, Taiwan

[73] Assignee: Asia Vital Components Co., Ltd., Taipei, Taiwan

[21] Appl. No.: 905,089

[22] Filed: Aug. 1, 1997

[51] Int. Cl.[6] ................................................ H05K 7/20
[52] U.S. Cl. .................... 361/697; 165/80.3; 165/122; 165/165; 257/722; 257/719; 415/178; 361/719; 361/704
[58] Field of Search ..................................... 361/687, 695, 361/697, 704, 709, 710, 717, 718; 165/80.3, 80.4, 185; 257/678, 718, 674, 706; 29/827; 415/177, 178, 208.3, 213.1, 214.1; 454/184; 267/150, 156, 160; 248/316.7, 505; 411/500–528, 900

[56] References Cited

U.S. PATENT DOCUMENTS

| | | | |
|---|---|---|---|
| 5,329,426 | 7/1994 | Villani | 361/719 |
| 5,368,094 | 11/1994 | Hung | 165/80.3 |
| 5,430,610 | 7/1995 | Hung | 361/697 |
| 5,724,228 | 8/1996 | Lee | 361/697 |

*Primary Examiner*—Leo P. Picard
*Assistant Examiner*—Michael Datskovsky

[57] ABSTRACT

A CPU heat dissipating device includes a base made of heat conductive material, having a plurality of spaced fins defining air passages therebetween. A fan is disposed on the fins to induce force convection. An enlarged channel is formed between the fins to received therein an I-shaped spring plate having four co-planar limbs, each having an arm extending therefrom and substantially normal thereto with a catch formed on the free end of the arm to be received within a corresponding hole formed on a CPU casing. A circular bore is formed on the bottom of the channel and in communication therewith by means of a neck which supports the spring plate thereon. A circular rod is rotatably received within the bore, on which two radially-extending projections are provided. A transverse extension is provided on the rod for manually rotating the rod about its central axis so as to rotate the radial projections between a disengaged position where the projections are not in contact engagement with the spring plate and an engaged position where the projections are brought into contact engagement with and thus causing elastic deformation of the spring plate so as to drive the catches of the arms of the spring plate to engage the holes of the CPU casing and thus securing the heat dissipating device to the CPU.

2 Claims, 5 Drawing Sheets

5,835,347

CPU HEAT DISSIPATING DEVICE

FIELD OF THE INVENTION

The present invention relates generally to a device for dissipating heat from a computer central processing unit (CPU) and in particular to a force convection type CPU heat dissipating device.

BACKGROUND OF THE INVENTION

The advance of electronic technology has dramatically improved the circuit configuration inside a chip, such as a central processing unit (CPU), and more and more electronic elements are compacted into a smaller and smaller CPU to improve its performance. This brings about a significant temperature rise problem. Since the CPU may only operate properly in a given range of temperature, significant temperature increase due to heat generated by the compact circuit inside the CPU would obviously cause abnormal operation.

Thus, the most advanced CPU is often devised with heat dissipator or radiator. An example of the CPU with heat dissipator is shown in FIG. 5 of the attached drawings. The conventional CPU heat dissipator, designated at 100 in FIG. 5, to be attached to a CPU 102 that is generally mounted on a circuit board 104, comprises a plurality of fins 106 spaced from each other to define air flow passages therebetween. Due to free convection, heat may be dissipated through the fins 106. To enhance the heat dissipation, the fins have quite a length. Using free convection to bring away heat is an inefficient manner. Further, the great length of the conventional heat dissipator may cause problem in arranging the heat dissipator into a very small sized, advanced computer.

It is therefore desirable to provide a CPU heat dissipating device which makes use of force convection provided by a fan to remove heat from the CPU in a more efficient way.

SUMMARY OF THE INVENTION

The principal object of the present invention is to provide a CPU heat dissipating device which removes heat from the CPU in a more efficient manner.

It is another object of the present invention to provide a CPU heat dissipating device which is ready to be attached to and/or detached from the CPU.

To achieve the above objects, there is provided a CPU heat dissipating device comprising a base made of heat conductive material, having a plurality of spaced fins defining air passages therebetween. A fan is disposed on the fins to induce force convection. An enlarged channel is formed between the fins to received therein an I-shaped spring plate having four co-planar limbs, each having an arm extending therefrom and substantially normal thereto with a catch formed on the free end of the arm to be received within a corresponding hole formed on a CPU casing. A circular bore is formed on the bottom of the channel and in communication therewith by means of a neck which supports the spring plate thereon. A circular rod is rotatably received within the bore, on which two radially-extending projections are provided. A transverse extension is provided on the rod for manually rotating the rod about its central axis so as to rotate the radial projections between a disengaged position where the projections are not in contact engagement with the spring plate and an engaged position where the projections are brought into contact engagement with and thus causing elastic deformation of the spring plate so as to drive the catches of the arms of the spring plate to engage the holes of the CPU casing and thus securing the heat dissipating device to the CPU.

BRIEF DESCRIPTION OF THE DRAWINGS

The present invention will be better understood from the following description of a preferred embodiment of the present invention, with reference to the attached drawings, wherein.

DETAILED DESCRIPTION OF THE PREFERRED EMBODIMENT

Figure 1:
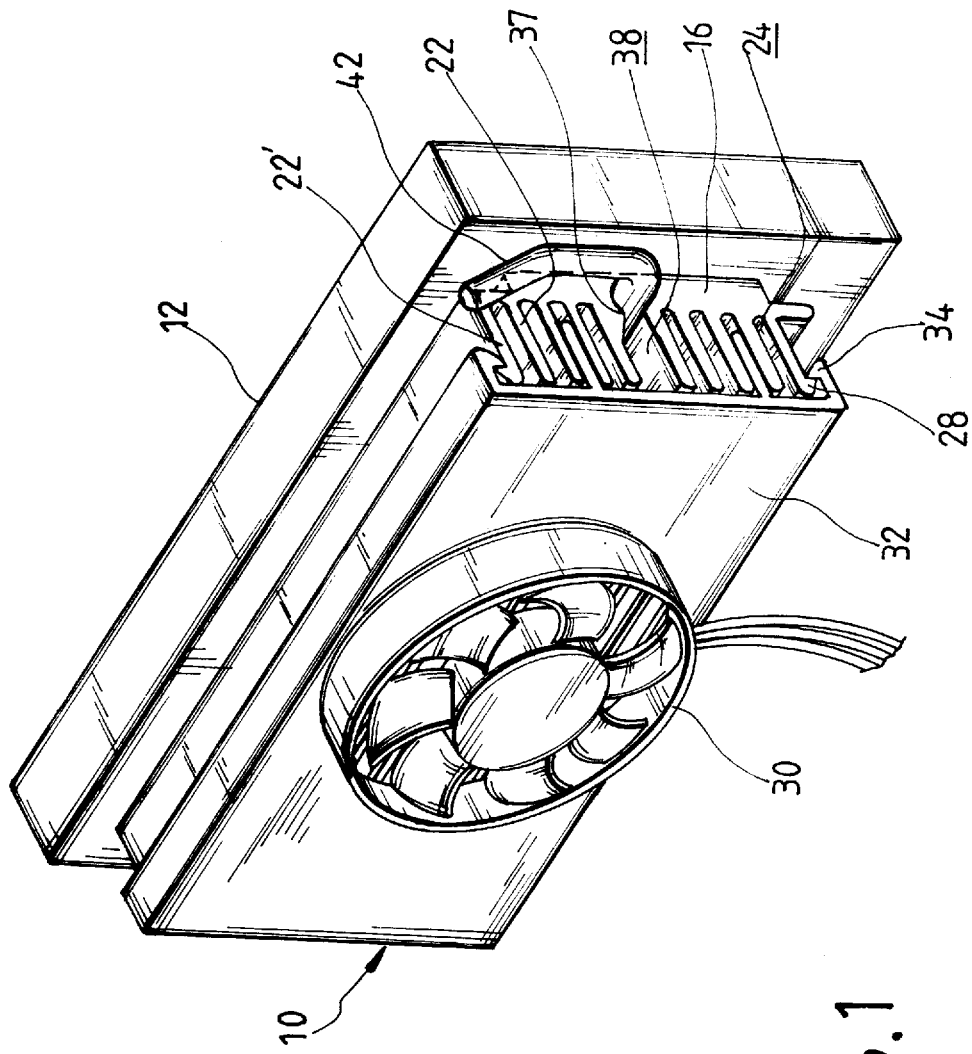
FIG. 1 is a perspective view showing a CPU heat dissipating device constructed in accordance with the present invention.
Figure 2:
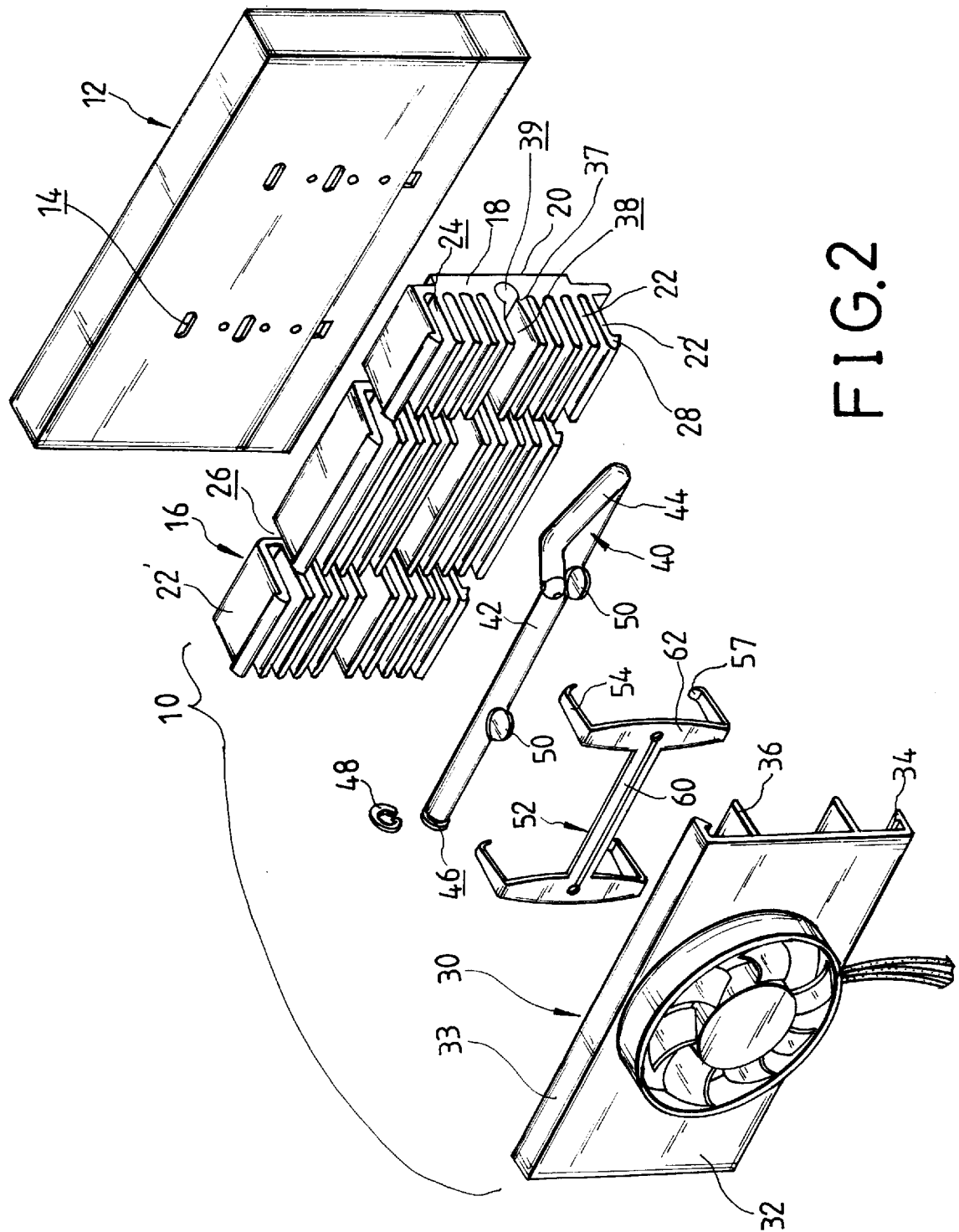
FIG. 2 is an exploded perspective view of the CPU heat dissipating device.

With reference to the drawings and in particular to FIGS. 1 and 2, wherein a CPU heat dissipating device constructed in accordance with the present invention, generally designated with reference numeral 10, is shown, the CPU heat dissipating device in accordance with the present invention is adapted to be mounted on a CPU, designated at 12, having a casing with a plurality of holes/slots 14 provided on a surface, preferably a plain surface, thereof.

The CPU heat dissipating device 10 comprises a base 16 made of a material of high heat conductivity. The base 16 has a bottom 18 having a surface 20 complementary in shape to the surface of the CPU casing so as to be snugly mounted thereon and in a close and tight contact engagement therewith for receiving heat therefrom. A plurality of fins 22 are integrally formed with and extending from the bottom 18 of the base 16 in a direction opposite to the CPU casing for removal of heat from the CPU 12 by means of free convection. The fins 22 are preferably arranged to be parallel and spaced from each other for forming a plurality of air flow passages 24 extending in a first direction for more efficient removal of the heat.

Preferably, each of the fins 22 has two cutouts 26 formed thereon so as to divide the fin 22 into spaced segments. The cutouts 26 are formed on the fins 22 so as to define two second passages extending in a second direction which is preferably normal to the first direction.

Two of the fins 22, which are designated with reference numeral 22', are located at two outermost locations. The outermost fins 22' comprise a sideways-extending flange 28 opposite to each other.

A force convection device, such as a fan 30, is provided to be fixed to the free ends of the fins 22 and 22'. The fan 30 comprises a support plate 32 having two opposite side walls 33 formed on two opposite edges thereof, each having an inward-extending flange 34, corresponding to and engageable with the sideways extending flanges 28 to hold the fan 30 on the base 16.

The support plate 32 of the fan 30 comprises two ribs 36 to be received within corresponding ones of the first passages 24 of the base 16 for the purpose to be described.

The base 16 comprises a central channel 38 which extends in the first direction and parallel with the first passages 24 with a circular bore 39 formed on the bottom thereof and separated by a neck 37. A crank shaft 40 comprises a straight section 42 which comprises a circular cross section to be rotatably received within the circular bore 39 and retained therein by the neck 37. The section 42 has two opposite ends extending out of the bore 39 at two ends of the base 16 in the first direction. One of the ends of the section 42 has a transverse extension 44 mounted thereon to allow a user to rotate the section 42 within the bore 39 about a central axis thereof. The opposite end of the section 42 is provided with a circumferential slot 46 for receiving therein a C-ring 48 to retain the crank shaft 40 within the bore 39.

The section 42 of the crank shaft 40 comprises at least one, preferably more than one, such as two, transverse projection 50 formed thereon and extending in a radial direction to be rotated with the section 42 between an engaged position and a disengaged position.

A sprint plate 52, preferably in the form of an "I", comprises an elongated central strip 60 received within channel 38 with two pairs of lateral extensions 62 laterally extending from two opposite edges thereof on a common plane with the central strip 60 to be received within the second passages defined by the cutouts 26 of the fins 22 and 22'. The ribs 36 of the support plate 32 of the fan 30 are sized so as to be in contact engagement with or having a small gap with the lateral extensions 62. Each of the lateral extensions 62 comprises an arm 54 extending in a direction normal to the plane of the spring plate 52, through a corresponding one of the first passages 24 and notches or holes 56 (see FIGS. 3 and 4) formed on the bottom 18 of the base 16, to have free end thereof received within the slots 14 of the CPU casing. Each of the arms 54 is provided with a catch 57 at the free end thereof that is received in one of the slots 14 of the CPU casing.

Figure 3:
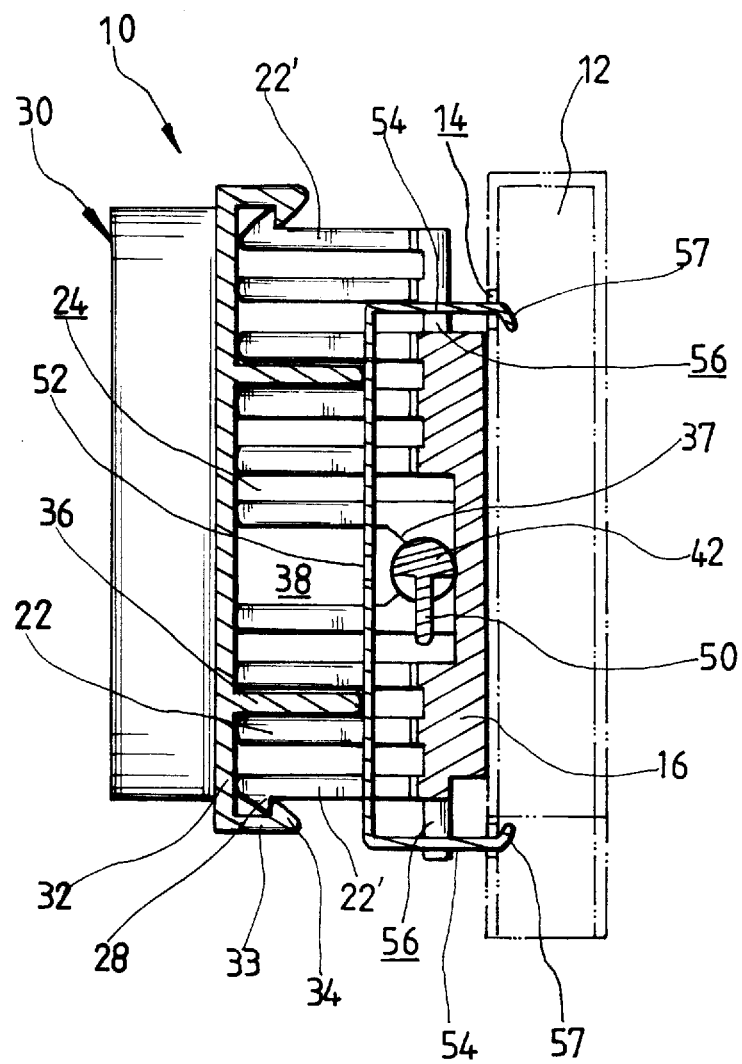
FIG. 3 is a cross-sectional view showing the disengaged condition of the CPU heat dissipating device.
Figure 4:
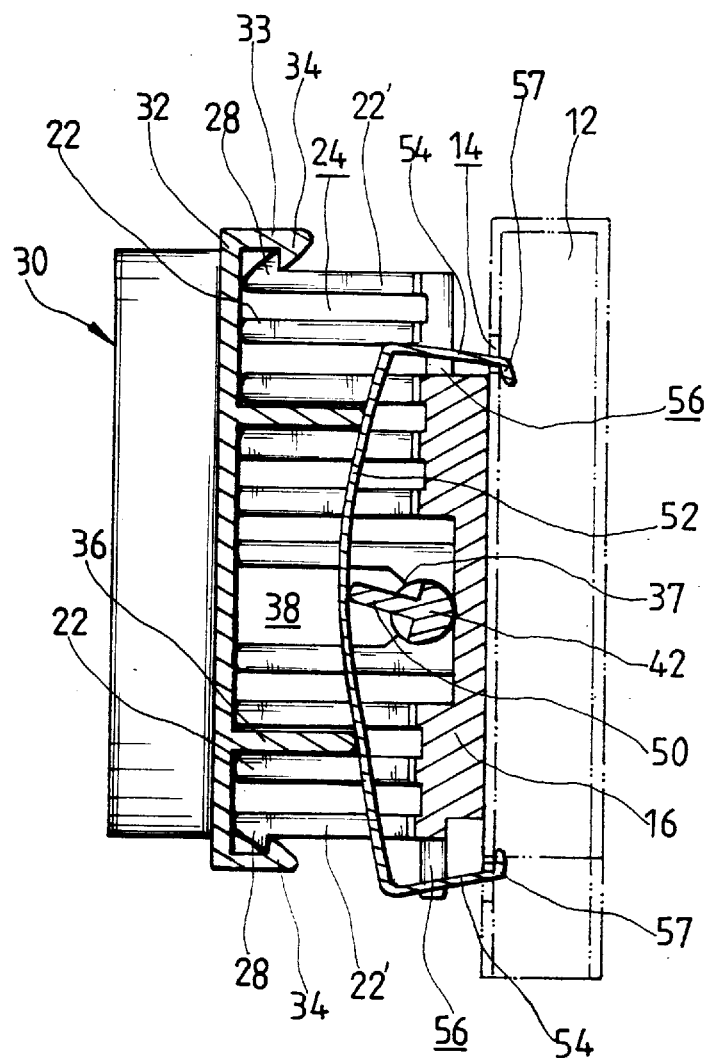
FIG. 4 is a cross-sectional view showing the engaged condition of the CPU heat dissipating device.
Figure 5:
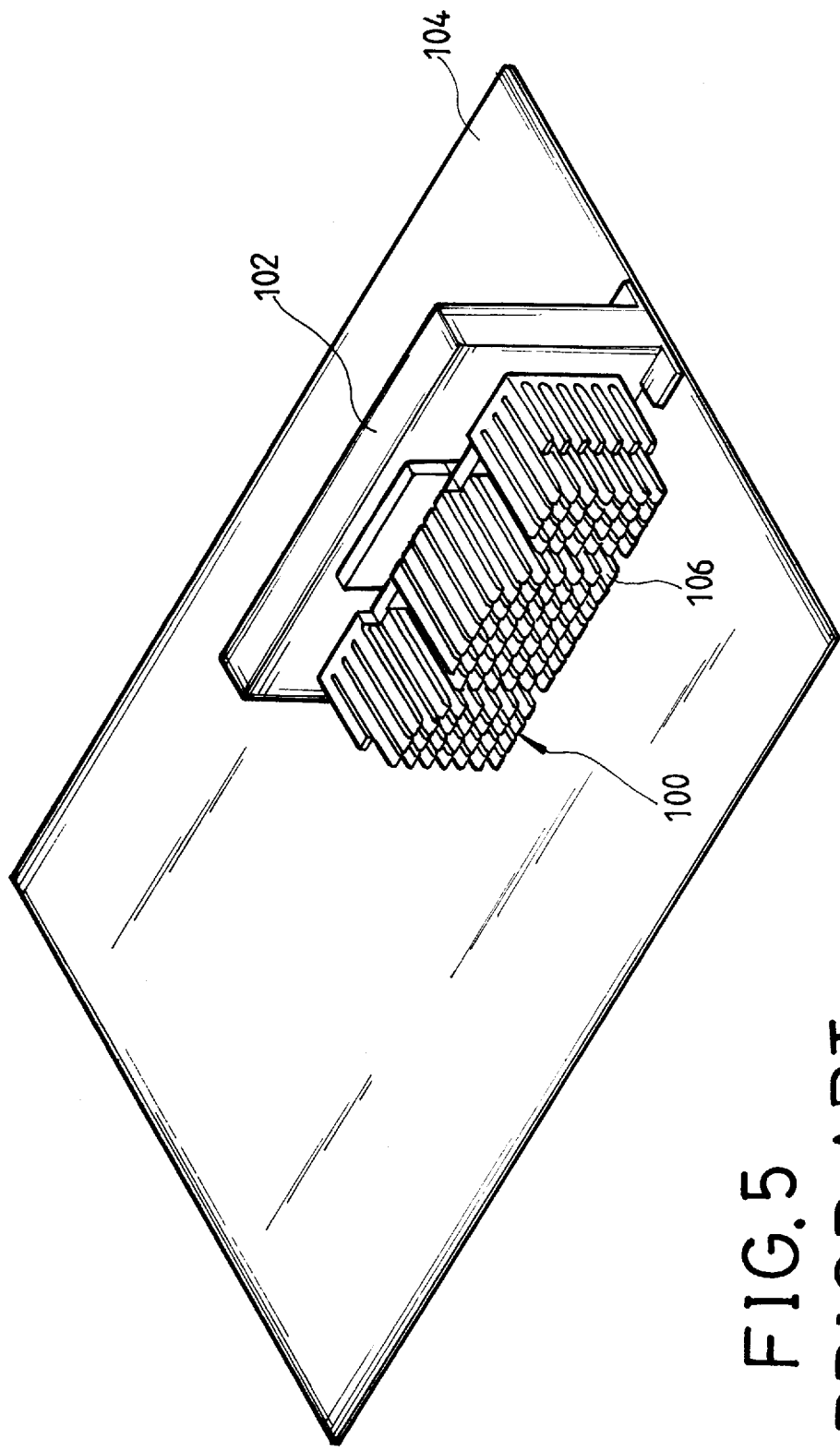
FIG. 5 is a perspective view showing a conventional heat dissipator mounted on a CPU which is connected to a printed circuit board.

The at least one transverse projection 50 formed on the section 42 of the crank shaft 40 is sized so that when the section 42 is rotated by the transverse extension 44 from the disengaged position, as shown in FIG. 3 where the transverse projection 40 is separated from the spring plate 52, to an engaged position, as shown in FIG. 4 where the transverse projection 40 engages the spring plate 52 and brings the lateral extensions 62 into tight contact engagement with the ribs 36 of the support plate 32 of the fan 32 so that with the engagement between the ribs 36 and the extensions 62, the rotation of the transverse extension 44 force the spring plate 52 to elastically deform in a direction away from the bottom 18 of the base 16 and toward the support plate 32 of the fan 30. With the elastic deformation of the spring plate 52, the arms 54 of the spring plate 52 is rotated to have the catches 57 thereof engaging the slots 14 of the CPU casing so as to fix the base 16 (on which the fan 32 is fixed) on the CPU 12.

When the crank shaft 40 is rotated from the engaged position to the disengaged position, the transverse projection 50 of the crank shaft 40 is released from the engagement with the spring plate 52 and the spring plate 52 is allowed to spring back to its original configuration, disengaging the catches 57 from the slots 14 of the CPU casing and thus allowing the heat dissipating device 10 to be detached from the CPU 12.

It is apparent that although the invention has been described in connection with the preferred embodiment, it is contemplated that those skilled in the art may make changes to certain features of the preferred embodiment without altering the basic concept of the invention and without departing from the spirit and scope of the invention as defined in the appended claims.

What is claimed is:

1. A CPU heat dissipating device adapted to be mounted to a casing of a CPU having a surface on which slots are provided, the CPU heat dissipating device comprising:

a base made of a material of high heat conductivity, having a bottom configured to be in snugly tight engagement with the casing surface for heat transfer purpose and a plurality of fins extending from the bottom in a direction to have free ends thereof away from the CPU, the fins being arranged to spaced from each other so as to define a plurality of passages extending in a first direction, the base having a channel extending in the first direction, the channel having a bottom defining a circular bore with a neck formed therebetween, the fins comprising two outermost ones, each having a sideways-extending flange;

a fan supported on a support plate which is supported on the free ends of the fins, the support plate having two ribs extending therefrom to be respectively received within two corresponding ones of the passages, the support plate having two lateral side walls each having an inward flange to engage the sideways-extending flanges of the outermost fins for holding the fan on the fins;

a crank shaft having a circular section received and extending along the circular bore to be rotatable therein about a central axis thereof, at least one transverse projection being provided on the circular section, the circular section having two ends located outside the bore of which one has a transverse extension thereon for manually rotating the circular section about its central axis between a disengaged position and an engaged position and a second one of the ends having a circumferential slot to receive therein a C ring for holding the crank shaft within the bore; and a spring plate having an elongated central plain strip received within the channel of the base, two pairs of lateral extensions extending on the plane of the plain strip laterally from two opposite edges of the strip in opposite directions to be received within cutouts formed through the fins in a second direction substantially normal to the first direction, each of the lateral extensions having an arm extending therefrom in a direction substantially normal to the plane of the strip to have a catch that is formed on free end thereof extending into a corresponding one of the slots formed on the CPU casing, the central strip being so received within the channel to be supported on the neck with the lateral extensions in contact engagement with and fixed by the ribs of the support plate of the fan so that when the crank shaft is rotated from the disengaged position to the engaged position, the at least one transverse projection of the circular section of the crank shaft is brought into contact engagement with the central strip of the spring plate, the transverse projection being sized so that the contact engagement thereof with the spring plate elastically deforms the spring plate in a direction away from the crank shaft with the lateral extensions fixed by the ribs of the support plate of the fan, which elastic deformation of the spring plate moves the catches of the arms relative to the slots of the CPU casing so as to have the catches engage the slots and thus securing the heat dissipating device on the CPU.

2. The CPU heat dissipating device as claimed in claim 1, wherein the circular section of the crank shaft comprises two transverse projections spaced from each other in the first direction and extending in a common radial direction.

* * * * *